United States Patent
Seo et al.

(10) Patent No.: US 11,600,340 B2
(45) Date of Patent: *Mar. 7, 2023

(54) SEMICONDUCTOR MEMORY DEVICE EMPLOYING PROCESSING IN MEMORY (PIM) AND OPERATION METHOD OF THE SEMICONDUCTOR MEMORY DEVICE

(71) Applicants: Samsung Electronics Co., Ltd., Suwon-si (KR); Seoul National University R&DB Foundation, Seoul (KR)

(72) Inventors: Seungwoo Seo, Seoul (KR); Byeongho Kim, Seoul (KR); Jaehyun Park, Busan (KR); Jungho Ahn, Seoul (KR); Minbok Wi, Seoul (KR); Sunjung Lee, Geoje-si (KR); Eojin Lee, Suwon-si (KR); Wonkyung Jung, Suwon-si (KR); Jongwook Chung, Seoul (KR); Jaewan Choi, Incheon (KR)

(73) Assignees: Samsung Electronics Co., Ltd., Suwon-si (KR); Seoul National University R&DB Foundation, Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/462,298

(22) Filed: Aug. 31, 2021

(65) Prior Publication Data
US 2021/0398597 A1 Dec. 23, 2021

Related U.S. Application Data

(63) Continuation of application No. 16/833,864, filed on Mar. 30, 2020, now Pat. No. 11,139,033.

(30) Foreign Application Priority Data

Oct. 10, 2019 (KR) .................. 10-2019-0125689

(51) Int. Cl.
*G11C 16/30* (2006.01)
*G06N 3/02* (2006.01)
(Continued)

(52) U.S. Cl.
CPC ............ *G11C 16/30* (2013.01); *G06N 3/02* (2013.01); *G11C 5/025* (2013.01); *G11C 16/10* (2013.01)

(58) Field of Classification Search
CPC ......... G11C 16/30; G11C 5/025; G11C 16/10; G06N 3/02
(Continued)

(56) References Cited

U.S. PATENT DOCUMENTS

| 9,997,232 B2 | 6/2018 | Murphy |
| 10,198,349 B2 | 2/2019 | Breternitz et al. |

(Continued)

FOREIGN PATENT DOCUMENTS

| CN | 108388498 A | 8/2018 |
| KR | 10-2020-0081045 A | 7/2020 |

OTHER PUBLICATIONS

Liu et al., "Processing-in-Memory for Energy-efficient Neural Network Training: A Heterogeneous Approach," IEEE 2018, pp. 1-14.
(Continued)

*Primary Examiner* — Huan Hoang
(74) *Attorney, Agent, or Firm* — NSIP Law

(57) ABSTRACT

A semiconductor memory device includes a plurality of memory banks including a first memory bank group including a computation circuit and a second memory bank group without a computation circuit; and a control circuit configured to control a PIM operation by the first memory bank group to be performed together with processing of memory
(Continued)

requests for the plurality of memory banks while satisfying a maximum power consumption condition of the semiconductor memory device.

22 Claims, 9 Drawing Sheets

(51) Int. Cl.
*G11C 5/02* (2006.01)
*G11C 16/10* (2006.01)

(58) Field of Classification Search
USPC .................................................. 365/185.11
See application file for complete search history.

(56) References Cited

U.S. PATENT DOCUMENTS

| | | | |
|---|---|---|---|
| 2017/0285988 A1 | 10/2017 | Dobelstein et al. | |
| 2018/0275883 A1* | 9/2018 | Lea | G11C 11/4097 |
| 2019/0079886 A1 | 3/2019 | Malladi et al. | |
| 2020/0210296 A1 | 7/2020 | Kang et al. | |
| 2020/0243154 A1 | 7/2020 | Sity et al. | |

OTHER PUBLICATIONS

Kim et al., "Neurocube: A Programmable Digital Neuromorphic Architecture with High-Density 3D Memory," 2016 ACM/IEEE 43rd Annual International Symposium on Computer Architecture, IEEE computer society, pp. 380-392.

Shin et al., "McDRAM: Low Latency and Energy-Efficient Matrix Computations in DRAM," IEEE Transactions on Computer-Aided Design of Integrated Circuits and Systems, vol. 37, No. 11, Nov. 2018, pp. 2613-2622.

Extended European search report issued by the European Patent Office dated Sep. 25, 2020 in the examination of the European Patent Application No. 20174182.4 (8 pages in English).

Gao, Mingyu, et al. "Tetris: Scalable and Efficient Neural Network Acceleration with 3d Memory." Proceedings of the Twenty-Second International Conference on Architectural Support for Programming Languages and Operating Systems, Apr. 8-12, 2017, pp. 751-764.

* cited by examiner

FIG. 6

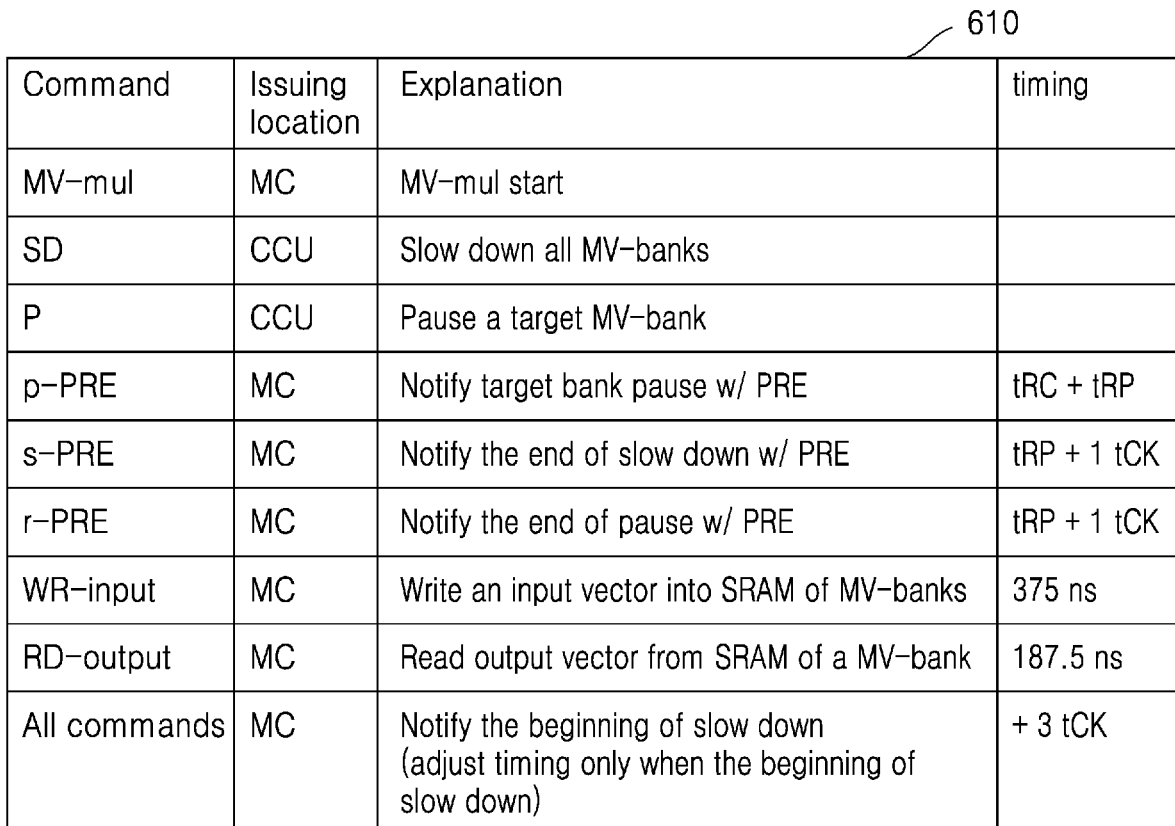

| Command | Issuing location | Explanation | timing |
|---|---|---|---|
| MV-mul | MC | MV-mul start | |
| SD | CCU | Slow down all MV-banks | |
| P | CCU | Pause a target MV-bank | |
| p-PRE | MC | Notify target bank pause w/ PRE | tRC + tRP |
| s-PRE | MC | Notify the end of slow down w/ PRE | tRP + 1 tCK |
| r-PRE | MC | Notify the end of pause w/ PRE | tRP + 1 tCK |
| WR-input | MC | Write an input vector into SRAM of MV-banks | 375 ns |
| RD-output | MC | Read output vector from SRAM of a MV-bank | 187.5 ns |
| All commands | MC | Notify the beginning of slow down (adjust timing only when the beginning of slow down) | + 3 tCK |

SEMICONDUCTOR MEMORY DEVICE EMPLOYING PROCESSING IN MEMORY (PIM) AND OPERATION METHOD OF THE SEMICONDUCTOR MEMORY DEVICE

CROSS-REFERENCE TO RELATED APPLICATIONS

This application is a continuation of U.S. application Ser. No. 16/833,864 filed on Mar. 30, 2020, which claims the benefit under 35 USC § 119(a) of Korean Patent Application No. 10-2019-0125689, filed on Oct. 10, 2019 in the Korean Intellectual Property Office, the entire disclosures of which are incorporated herein by reference for all purposes.

BACKGROUND

1. Field

The following description relates to semiconductor memory devices employing processing in memories (PIMs) and operation methods of the semiconductor memory devices.

2. Description of Related Art

A semiconductor memory device according to the related art has a completely separate function from a processor performing an arithmetic operation. Therefore, in a system that implements applications such as a neural network, big data, and the Internet of Things (IoT), in which a large amount of data is required to be processed, a large amount of data is transmitted or received between the semiconductor memory device and the processor and thus bottlenecks may occur frequently. In order to solve such a problem, research into a processing in memory (PIM) as a semiconductor memory device, which combines the function of a processor for performing an arithmetic operation with a memory function, is underway.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor memory device employing processing in memory (PIM) includes a plurality of memory banks including a first memory bank group including a computation circuit and a second memory bank group without a computation circuit; and a control circuit configured to control a PIM operation by the first memory bank group to be performed together with processing of memory requests for the plurality of memory banks while satisfying a maximum power consumption condition of the semiconductor memory device.

The control circuit may control a sum of power consumed for the processing of the memory requests and power consumed for the PIM operation to satisfy the maximum power consumption condition by adjusting and/or pausing the PIM operation by the first memory bank group.

The control circuit may include a request counter to count memory requests for each of the plurality of memory banks according to a predetermined period, and the control circuit may, based on numbers counted by the request counter, perform scheduling on the processing of the memory requests and the PIM operation.

The control circuit may, when a number corresponding to the second memory bank group among the numbers counted by the request counter is equal to or greater than a preset threshold value, slow down the PIM operation by the first memory bank group in order to process a memory request for the second memory bank group.

When the first memory bank group includes a first memory bank and a second memory bank, and a number corresponding to the first memory bank among the numbers counted by the request counter is equal to or greater than the preset threshold value, the control circuit may pause the PIM operation by the first memory bank and slow down the PIM operation by the second memory bank in order to process a memory request for the first memory bank.

The control circuit may broadcast a command for instructing an adjustment or pause of the PIM operation by the first memory bank group to the first memory bank group according to a preset timing.

A number of memory banks included in the first memory bank group among the plurality of memory banks may be configured such that when all of the memory banks included in the first memory bank group perform a read operation for the PIM operation, power consumed by the semiconductor memory device satisfies the maximum power consumption condition.

Each of the plurality of memory banks may include one or more dynamic random access memory (DRAM) arrays, and the memory request may be a DRAM request comprising at least one of read, write, copy, and erase.

The computation circuit included in the first memory bank group may perform an operation using data read from a corresponding memory bank, and to rewrite a result of the operation to the corresponding memory bank or to output the result to the outside.

The computation circuit may include hardware that performs at least one of an arithmetic operation, a logic operation, and a shift operation.

In another general aspect, a method of operating a semiconductor memory device employing processing in memory (PIM) includes processing memory requests for a plurality of memory banks including a first memory bank group including a computation circuit and a second memory bank group without a computation circuit; and controlling a PIM operation by the first memory bank group to be performed together with processing of the memory requests while satisfying a maximum power consumption condition of the semiconductor memory device.

In another general aspect, a non-transitory computer-readable recording medium having recorded thereon one or more programs including instructions executes the above-described method.

In another general aspect, a semiconductor memory device includes a first memory bank including a computation circuit configured to perform a processing in memory (PIM) operation; a second memory bank to process one or more memory requests concurrently with the PIM operation; and a control circuit to control the PIM operation so that a sum of power consumed for processing the one or more memory requests and a power consumed for the PIM operation does not exceed a maximum threshold.

The first memory bank may be included in a first memory bank group having two or more memory banks, and each of the memory banks of the first memory bank group may include a computation circuit. The second memory bank may be included in a second memory bank group having two or more memory banks, and none of the memory banks of the second memory bank group may include a computation circuit.

The first memory bank may be included in a first memory bank group having two or more memory banks, and the two or more memory banks of the first memory bank group may include a third memory bank that does not include a computation circuit. The second memory bank may not include a computation circuit, the second memory bank may be included in a second memory bank group having two or more memory banks, and the two or more memory banks of the second memory bank group may include a fourth memory bank that includes a computation circuit.

Other features and aspects will be apparent from the following detailed description, the drawings, and the claims.

BRIEF DESCRIPTION OF THE DRAWINGS

FIG. 6 is a table illustrating an example of commands used in a scheduling process.

Figure 1:
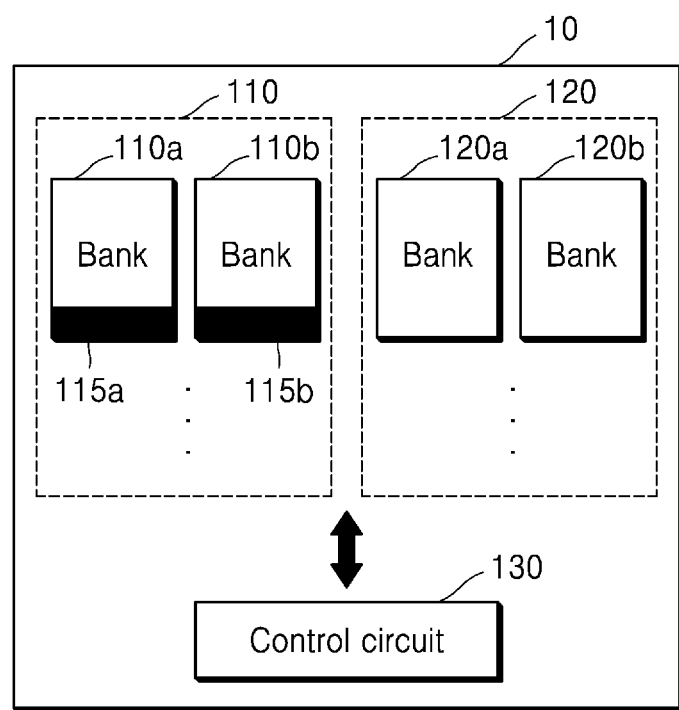
FIG. 1 is a block diagram of a semiconductor memory device according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all examples are not limited thereto.

FIG. 1 is a block diagram of a semiconductor memory device 10 according to an example.

Referring to FIG. 1, the semiconductor memory device 10, which is a memory device employing processing in memory (PIM), may include a plurality of memory banks and a control circuit 130. Only some components are shown in the semiconductor memory device 10 of FIG. 1. The semiconductor memory device 10 may further include general components other than the components shown in FIG. 1. For example, the semiconductor memory device 10 may further include an internal memory bus. The internal memory bus may refer to a data transmission path formed to transmit and receive data between the components in the semiconductor memory device 10.

The plurality of memory banks may include a first memory bank group 110 and a second memory bank group 120. The first memory bank group 110 may include one or more memory banks including a computation circuit. For example, the first memory bank group 110 may include a memory bank 110a including a computation circuit 115a and a memory bank 110b including a computation circuit 115b. Each of the memory banks 110a and 110b includes the computation circuit 115a or the computation circuit 115b, and thus the memory bank 110a and the memory bank 110b may perform a PIM operation as well as process normal memory requests.

The memory request may refer to the inherent operation of the memory including at least one of read, write, copy, and erase. The PIM operation may refer to a computation operation including at least one of an arithmetic operation such as addition, multiplication, and accumulation and a logic operation such as AND, OR, and XOR. In an example, when the semiconductor memory device 10 is used to implement a recurrent neural network (RNN), the PIM operation may be a matrix vector multiplication operation, but is not necessarily limited thereto.

Each of the computation circuits 115a and 115b may refer to hardware that performs a computation operation within the memory bank 110a and the memory bank 110b. For example, each of the computation circuits 115a and 115b may include an arithmetic logic unit (ALU), which is hardware that performs at least one of an arithmetic operation, a logic operation, and a shift operation, and the computation operation may include a function operation including addition, subtraction, integration, accumulation, etc., but is not necessarily limited thereto. Each of the computation circuits 115a and 115b may be implemented as an array of a plurality of logic gates, or may be implemented as a combination of an array of logic gates and a buffer that temporarily stores data. Each of the computation circuits 115a and 115b may perform an operation using data read from the memory bank 110a or 110b corresponding to the computation circuit 115a and 115b, and write a result of the operation back into the corresponding memory bank 110a or 110b.

The second memory bank group 120 may include one or more memory banks that do not include a computation circuit. For example, the second memory bank group 120 may include a memory bank 120a and a memory bank 120b. The memory bank 120a and the memory bank 120b do not include a computation circuit, and thus the memory bank 120a and the memory bank 120b may not perform a PIM operation and may process only memory requests.

As described above, the semiconductor memory device 10 according to an example includes both the first memory bank group 110 including a computation circuit and the second memory bank group 120 that does not include a computation circuit, thereby performing the PIM operation concurrently with the processing of memory requests. Therefore, the semiconductor memory device 10 may operate as a memory and concurrently operate as an accelerator for driving a neural network, and thus the semiconductor memory device 10 may be used in a system requiring a concurrent processing of memory requests, a critical latency, or an operation on a great amount of data.

In addition, semiconductor memory devices may be determined to have a maximum power consumption condition for normal operation when manufactured. However, there is a problem in that conventional semiconductor memory devices employing a PIM do not consider the maximum power consumption condition and thus are not practically implemented or are implemented only under ideal conditions. On the contrary, the semiconductor memory device 10 according to the example is configured to concurrently perform the processing of the memory requests and the PIM operation while satisfying the maximum power consumption condition.

For example, the control circuit 130 may control the PIM operation by the first memory bank group 110 to be performed together with the processing of the memory requests for the plurality of memory banks while satisfying the maximum power consumption condition of the semiconductor memory device 10. The control circuit 130 may control the sum of power consumed for the processing of the memory requests and power consumed for the PIM operation to be within the maximum power consumption condition through the adjustment or pause of the PIM operation by the first memory bank group 110. In addition, the number of memory banks included in the first memory bank group 110 among the plurality of memory banks may be determined such that when all of the memory banks included in the first memory bank group 110 perform a read operation for the PIM operation, the power consumed by the semiconductor memory device 10 is within the maximum power consumption condition. Hereinafter, a method in which the semiconductor memory device 10 according to the example operates considering the maximum power consumption condition will be described in detail with reference to the drawings.

In FIG. 1, the first memory bank group 110 includes the two memory banks, that is, the memory banks 110a and 110b, and the second memory bank group 120 also includes the two memory banks, that is, the memory banks 120a and 120b, but this is only an example. Each of the first memory bank group 110 and the second memory bank group 120 may include only one memory bank or may include more than two memory banks.

Figure 2:
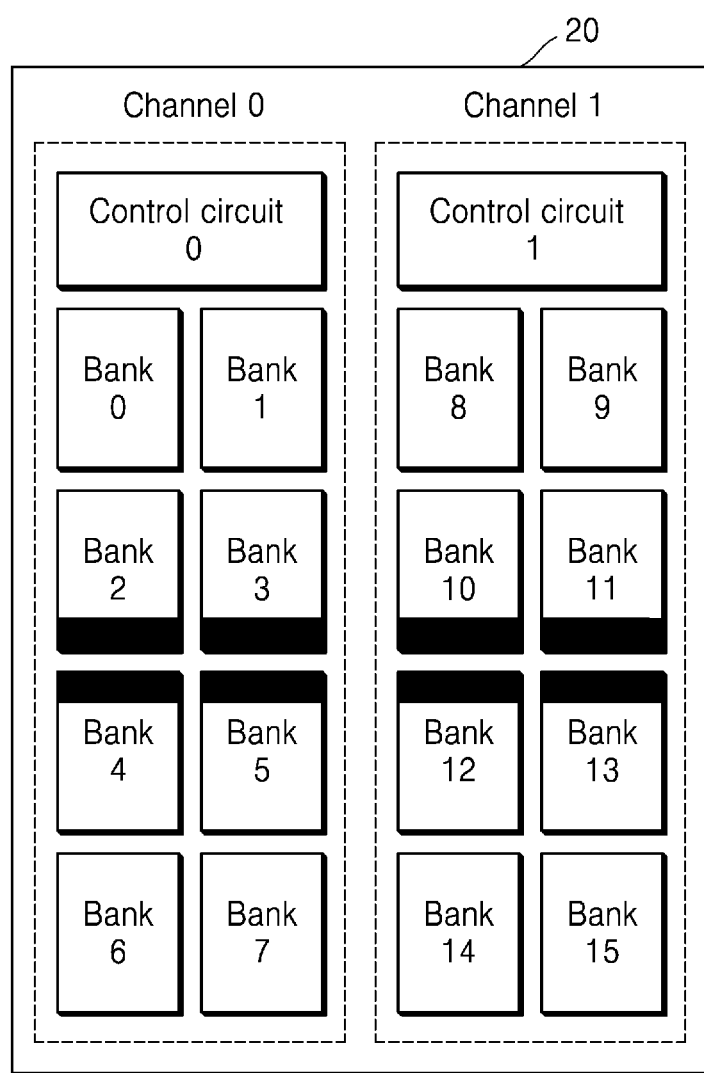
FIG. 2 is a block diagram of an example of a semiconductor memory device.

FIG. 2 is a block diagram of an example of a semiconductor memory device 20 according to some embodiments.

Referring to FIG. 2, the semiconductor memory device 20 is illustrated as an example of the semiconductor memory device 10 of FIG. 1. The semiconductor memory device 20 may include two memory channels channel 0 and channel 1. Each of the memory channels channel 0 and channel 1 may include a plurality of memory banks and a control circuit. For example, the memory channel channel 0 may include the plurality of memory banks Bank 0 to Bank 7, and may include the control circuit Control circuit 0. The memory channel channel 1 may include the plurality of memory banks Bank 8 to Bank 15, and may include the control circuit Control circuit As shown in FIG. 2, among the memory banks Bank 0 to Bank 7 included in memory channel channel 0, the memory banks Bank 2 to Bank 5 may include a computation circuit, and the memory banks Bank 0, Bank 1, Bank 6, and Bank 7 may not include a computation circuit. Among the memory banks Bank 8 to Bank 15 included in the memory channel channel 1, the memory banks Bank 10 to Bank 13 may include a computation circuit, and the memory banks Bank 8, Bank 9, Bank 14, and Bank 15 may not include a computation circuit. A black block included in a memory bank in FIG. 2 may refer to a computation circuit as shown in FIG. 1.

The memory banks Bank 2 to Bank 5 and Bank 10 to Bank 13 may correspond to the first memory bank group 110 of FIG. 1, the memory banks Bank 0, Bank 1, Bank 6 to Bank 9, Bank 14, and Bank 15 may correspond to the second memory bank group 120 of FIG. 1, and the control circuits Control circuit 0 and Control circuit 1 may correspond to the control circuit 130 of FIG. 1. The memory channels channel 0 and channel 1 may be configured in the same manner and may operate in parallel with each other. Only two memory channels are shown in the example of FIG. 2, but this is for convenience of description only. The semiconductor memory device 10 of FIG. 1 or the semiconductor memory device 20 of FIG. 2 may include a single memory channel or may include a greater number of memory channels operating in parallel with each other. Also, eight memory banks are included in one memory channel in the example of FIG. 2, but this is only for convenience of description. The memory banks included in one memory channel are not limited to the example.

Only eight memory banks among the sixteen memory banks included in the memory channels channel 0 and channel 1 may include a computation circuit. The PIM operation may consume more power than the processing of general memory requests, and thus the maximum power consumption condition of the semiconductor memory device 20 may not be satisfied when all of the sixteen memory banks include a computation circuit and perform the PIM operation. Accordingly, the semiconductor memory device 20 according to the example may perform the PIM operation by placing a computation circuit only in some of the memory banks in order to obtain the maximum performance while minimizing the area overhead within the available design space.

For example, assuming that all of the memory banks including the computation circuit concurrently perform the read operation for the PIM operation, the number of memory banks including the computation circuit is limited to eight such that the power consumed to drive the semiconductor memory device 20 does not exceed the maximum power consumption condition. The number of eight is merely an example and the example is not limited thereto. A number of memory banks including a computation circuit may be determined according to the maximum power consumption condition of the semiconductor memory device 20.

Figure 3:
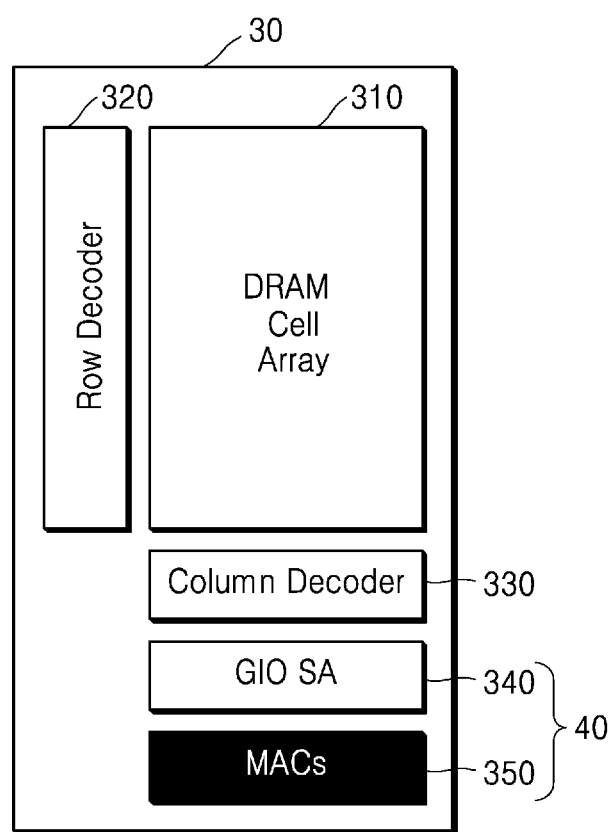
FIG. 3 is a diagram illustrating an example of a memory bank including a computation circuit.

FIG. 3 is a diagram illustrating an example of a memory bank 30 including a computation circuit.

Referring to FIG. 3, in the example in which the semiconductor memory device 20 is dynamic random access memory (DRAM), the memory bank 30 including the computation circuit is illustrated. The memory bank 30 may correspond to the memory bank 110a and the memory bank 110b of FIG. 1, or each of memory banks Bank 2 to Bank 5 and Bank 10 to Bank 13 of FIG. 2. The memory bank 30 may include a DRAM cell array 310 configured as one or more DRAM arrays. In this case, a memory request requested for the memory bank 30 may correspond to a DRAM request including at least one of read, write, copy, and delete.

A row decoder 320 and a column decoder 330 may be provided to select a specific memory cell included in the DRAM cell array 310 of the memory bank 30. When the row decoder 320 selects a row direction word line based on a received row address, and the column decoder 330 selects a column direction bit line based on a received column address, a memory cell corresponding to the selected row direction word line and column direction bit line may be selected. The row decoder 320 and the column decoder 330 are included in the memory bank 30 in FIG. 3, but this is only an example. According to a method of defining the memory bank 30, the row decoder 320 and the column decoder 330 may be disposed outside the memory bank 30.

A global input/output sense amplifier (GIO SA) 340 may serve as a buffer temporarily storing data read from the DRAM cell array 310. The GIO SA 340 may transfer the data read from the DRAM cell array 310 to multiply-accumulation units (MACSs) 350. The MACSs 350 may correspond to each of the computation circuit 115a and the computation circuit 115b of FIG. 1. The MACSs 350 may perform an operation using the data transmitted from the GIO SA 340 and output a result of the operation. Hereinafter, the GIO SA 340 and the MACSs 350 are referred to as a PIM operator 40 for convenience of description.

Figure 4:
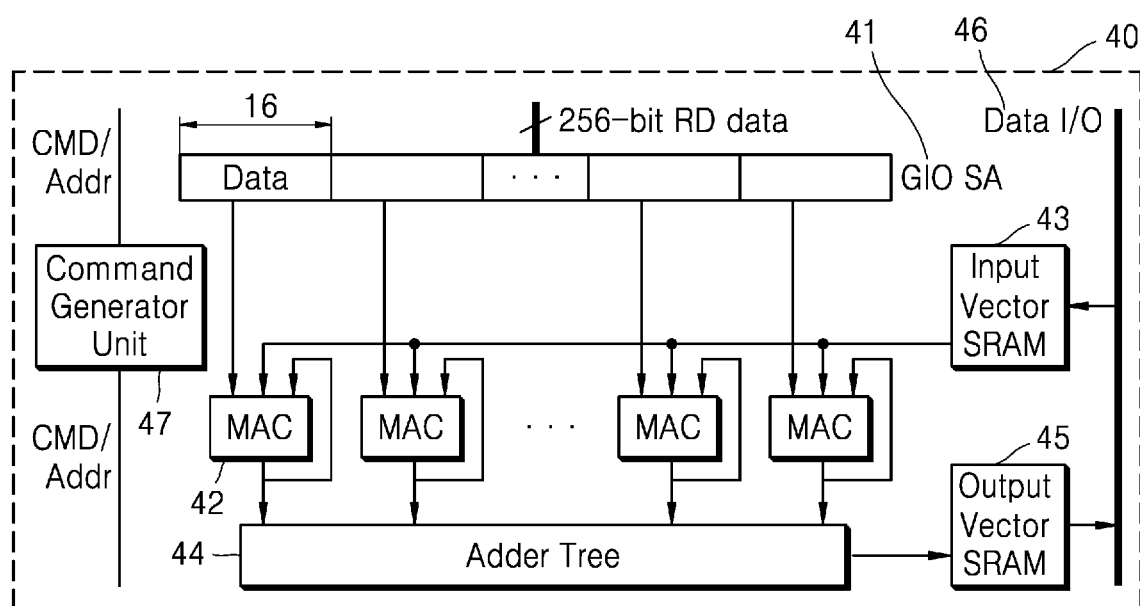
FIG. 4 is a diagram illustrating an example of a specific circuit structure of a processing in memory (PIM) operator.

FIG. 4 is a diagram illustrating an example of a specific circuit structure of a PIM operator 40.

Referring to FIG. 4, the specific circuit structure of the PIM operator 40 in an example in which a semiconductor memory device performs a matrix vector multiplication operation is shown. According to an example, a DRAM array may be configured to store 256 bits of data corresponding to at least one row of a matrix, and a GIO SA 41 may receive 256 bits of read data 256-bit RD data from the DRAM array. The DRAM array may include a plurality of DRAM cells, and each of the plurality of DRAM cells may store one bit of data. One or more DRAM cells of the plurality of DRAM cells may collectively represent one piece of data. For example, 16 bits of data may include 16 DRAM cells. The 16 bits of data corresponding to the 16 DRAM cells may correspond to each element of the matrix, and may be transferred to a corresponding MAC 42 and used as an operand. Input vector data, which is another operand for an operation, may be input through a data input/output path Data I/O. The input vector data may be stored in input vector static random access memory (SRAM) 43 and then transferred to each MAC 42. Each MAC 42 may perform an operation on the matrix data transferred from the DRAM array and the input vector data transferred from the input vector SRAM 43, and output a result of the operation. Results of the operation output from each MAC 42 may be summed up through an Adder Tree 44, and output vector data corresponding to a final operation result may be stored in an output vector SRAM 45. The output vector data stored in the output vector SRAM 45 may be output to the outside through a data input/output path Data I/O 46, and may be used for the operation again through the input vector SRAM 43. The PIM operator 40 may include a command generator unit 47 that receives a DRAM command and an address transmitted from a control circuit (e.g., the control circuits Control circuit 0 or Control circuit 1 of FIG. 2) and then converts the command into more detailed subcommands.

As described above, the memory bank 30 including the PIM operator 40 may be used to perform operations required for neural network implementation, but may be used to process general memory requests. However, after the data used for the PIM operation is read from one DRAM array, in order to read data used for the processing of the memory request from another DRAM data array, a process of precharging PRE the data used for the PIM operation and then activating ACT the data used for the processing of the memory request is required. The time required for reactivation after precharging is considerably long, and thus it may be desirable to minimize the number of times switching between the PIM operation and the processing of the memory request.

When priority is given to the PIM operation in order to minimize the number of times switching between the PIM operation and the processing of the memory request, the processing of the memory request may be impossible, and when the priority is given to the processing of the memory request, the efficiency of the PIM operation may be reduced excessively. Accordingly, a technique capable of concurrently performing the processing of the memory request while performing the PIM operation as efficiently as possible may be required. A semiconductor memory device (e.g., the semiconductor memory device 10 of FIG. 1 or the semiconductor memory device 20 of FIG. 2) according to the examples may perform concurrent processing of the memory request while performing the PIM operation as efficiently as possible through scheduling. Hereinafter, a scheduling process of the semiconductor memory device (e.g., the semiconductor memory device 10 of FIG. 1 or the semiconductor memory device 20 of FIG. 2) according to the examples will be described in detail with reference to FIG. 5.

Figure 5:
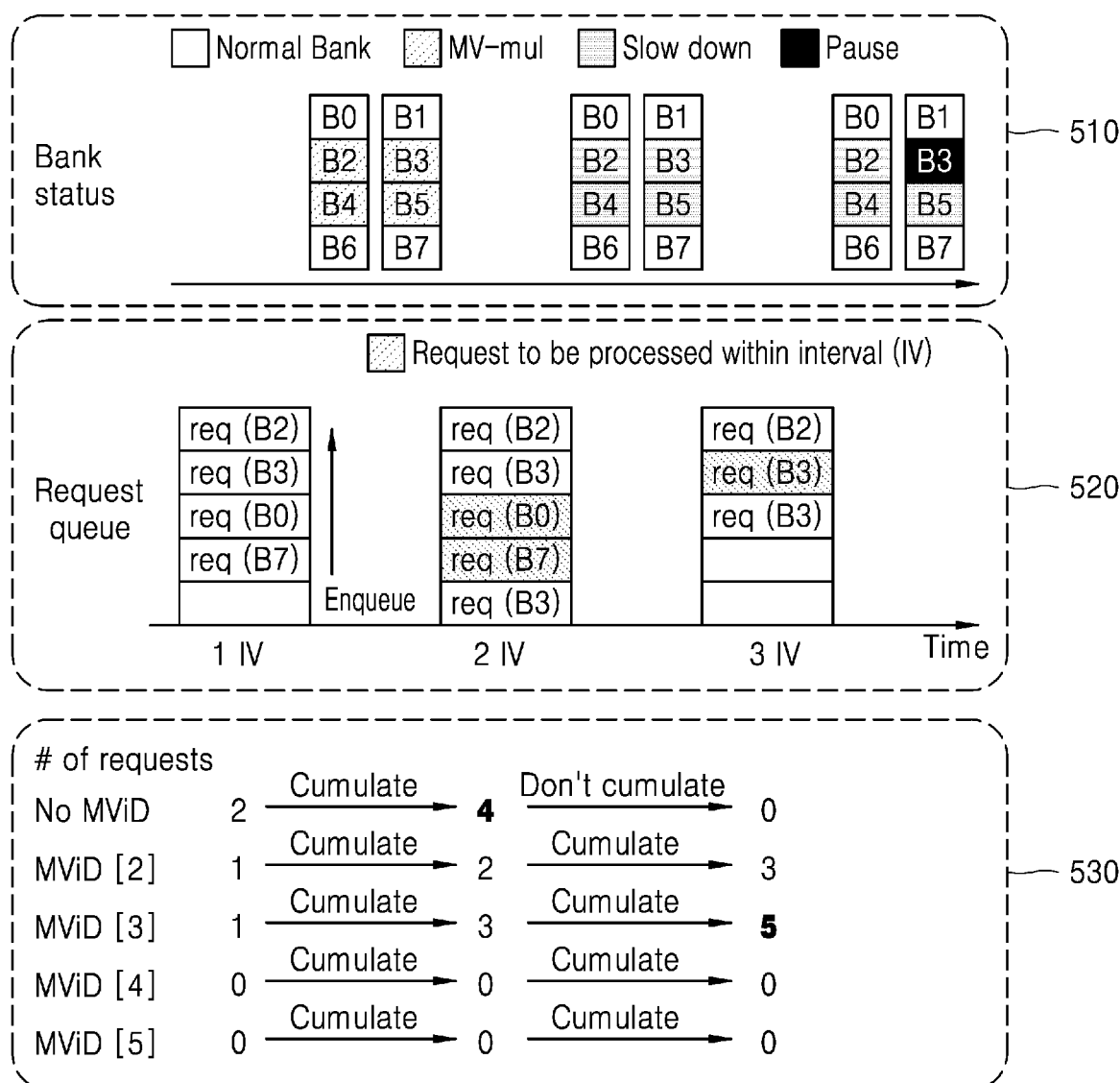
FIG. 5 is a diagram for describing a scheduling process according to an example.

FIG. 5 is a diagram for describing a scheduling process according to an example.

Referring to FIG. 5, an example of a process in which the memory channel Channel 0 included in the semiconductor memory device 20 of FIG. 2 performs concurrent processing of a memory request while performing a PIM operation as efficiently as possible through scheduling is illustrated. Although only the memory channel Channel 0 is described with reference to FIG. 5, the same content may be equally applied to other memory channels that may be included in the semiconductor memory device 20, as well as the memory channel Channel 1.

A first graph 510 of FIG. 5 shows the state of a memory bank over time. In the first graph 510, "Normal Bank" refers to a memory bank that does not include a computation circuit and may only perform the processing of memory requests, and "MV-mul" refers to a state in which a memory bank including a computation circuit and capable of performing the PIM operation performs a matrix vector multiplication operation as the PIM operation. In addition, "Slow down" refers to a state in which the memory bank including the computation circuit and capable of performing the PIM operation slows down the PIM operation, and "Pause" refers to a state in which the memory bank including the computation circuit and capable of performing the PIM operation pauses the PIM operation. As shown in FIG. 2, only the memory banks Bank 2 to Bank 5 include a computation circuit. In FIG. 5, memory banks Bank 0 to Bank 7 are briefly denoted by B0 to B7, respectively.

A second graph 520 shows the state of a memory request queue with respect to the memory banks in chronological order and indicates the memory requests that need to be processed within a particular interval IV. In the request queue on the second graph 520, an upper request represents an older memory request, and a lower request represents a younger memory request.

A third graph 530 shows the number of requests accumulated with respect to each memory bank. The number of requests accumulated with respect to each memory bank may be counted by a request counter. When the number counted by the request counter is equal to or greater than a preset threshold value, the processing of a memory request for the memory bank corresponding to the number may be performed. The preset threshold may be determined as a value that is set to prevent an excessive delay of the processing of the memory request while giving priority to the PIM operation. In FIG. 5, "MViD" refers to a memory bank including a computation circuit, and "No-MViD" refers to memory banks not including a computation circuit.

Referring to the first graph 510, the second graph 520, and the third graph 530 in FIG. 5 in chronological order, processing requests of memory requests for the memory banks Bank 2, Bank 3, Bank 0, and Bank 7 are accumulated on the request queue and numbers counted by the request counter are updated in a first interval 1 IV. The number of requests accumulated with respect to the memory banks Bank 0 and Bank 7 that do not include a computation circuit is 2, and the number of requests accumulated with respect to each of the memory banks Bank 2 and Bank 3 is 1. In the example of FIG. 5, when the threshold is 4, there is no memory bank having the number of accumulated requests equal to or greater than the threshold in the first interval 1 IV. Therefore, in the first interval 1 IV, the PIM operation by the memory banks Bank 2 to Bank 5 may be continuously performed.

Between the first interval 1 IV and a second interval 2 IV, processing requests of the memory request for the memory bank Bank 3 are newly accumulated in the request queue, and the numbers counted by the request counter are updated in the second interval 2 IV. The number of requests accumulated with respect to the memory banks Bank 0 and Bank 7 is 4, which is equal to or greater than the threshold. Accordingly, in the second interval 2 IV, the processing of memory requests for the memory banks Bank 0 and Bank 7 that do not include a computation circuit may be performed. When the PIM operation by the memory banks Bank 2 to Bank 5 is performed in the same manner, and the processing of memory requests for the memory banks Bank 0 and Bank 7 is added, the maximum power consumption condition may be no longer satisfied. Therefore, in order to satisfy the maximum power consumption condition while concurrently performing the processing of the memory requests for the memory banks Bank 0 and Bank 7 and continuously the PIM operation by the memory banks Bank 2 to Bank 5, the PIM operation by the memory banks Bank 2 to Bank 5 may slow down. The power consumption reduced by the slow-down of the PIM operation by the memory banks Bank 2 to Bank 5 may correspond to the power consumption required for the processing of the memory requests for the memory banks Bank 0 and Bank 7, but is not necessarily limited thereto.

In the third interval 3 IV, because the memory requests for the memory banks Bank 0 and Bank 7 are processed, only the processing requests of the memory requests for the memory banks Bank 2 and Bank 3 remain in the request queue, and the numbers counted by the request counter are updated. The number of requests accumulated with respect to the memory bank Bank 3 is 5, which is equal to or greater than the threshold. Accordingly, the processing of memory requests for the memory bank Bank 3 may be performed in the third interval 3 IV. Because the memory bank Bank 3 is MViD, the PIM operation by the memory bank Bank 3 must be paused in order to process the memory requests for the memory bank Bank 3. In addition, in order to satisfy the maximum power consumption condition while concurrently performing the processing of the memory request for the memory bank Bank 3 and the PIM operation, the PIM operation by the memory banks Bank 2, Bank 4, and Bank 5 may slow down.

As described above, the control circuit (e.g., the control circuit 130 of FIG. 1 or each of the control circuits Control circuit 0 and Control circuit 1 of FIG. 2) included in the semiconductor memory device 10 of FIG. 1 or the semiconductor memory device 20 of FIG. 2 may further include a request counter that counts memory requests for each of the plurality of memory banks according to a predetermined period, and based on numbers counted by the request counter, performs the processing of the memory requests and scheduling on the PIM operation.

When a number corresponding to a group of memory banks (e.g., the second memory bank group 120 of FIG. 1 or the memory banks Bank 0, Bank 1, Bank 6 to Bank 9, Bank 14, and Bank 15 of FIG. 2) that do not include a computation circuit among the numbers counted by the request counter is equal to or greater than the preset threshold value, in order to process a memory request for the group of memory banks that do not include the computation circuit, the control circuit (e.g., the control circuit 130 of FIG. 1 or each of the control circuits Control circuit 0 and Control circuit 1 of FIG. 2) may slow down the PIM operation by a group of memory banks (e.g., the first memory bank group 110 of FIG. 1 or the memory banks Bank 2 to Bank 5 and Bank 10 to Bank 13 of FIG. 2) that include the computation circuit.

When the group of memory banks (e.g., the first memory bank group 110 of FIG. 1 or the memory banks Bank 2 to Bank 5 and Bank 10 to Bank 13 of FIG. 2) that include the computation circuit includes a third memory bank and a fourth memory bank and a number corresponding to the third memory bank among the numbers counted by the request counter is equal to or greater than the preset threshold value, in order to process a memory request for the third memory bank, the control circuit (e.g., the control circuit 130 of FIG. 1 or each of the control circuits Control circuit 0 and Control circuit 1 of FIG. 2) may pause the PIM operation by the third memory bank and slow down the PIM operation by the fourth memory bank. When the PIM operation pauses, the memory bank may store an operation result up to present, precharge a currently activated DRAM row, and then activate the DRAM row corresponding to the memory request to process the memory request.

As described above, the semiconductor memory device (e.g., the semiconductor memory device 10 of FIG. 1 or the semiconductor memory device 20 of FIG. 2) according to the examples may concurrently perform the PIM operation as efficiently as possible through scheduling and the processing of the memory request. FIG. 5 is merely an example for describing the scheduling process performed by the semiconductor memory device (e.g., the semiconductor memory device 10 of FIG. 1 or the semiconductor memory device 20 of FIG. 2), but is not necessarily limited thereto, and scheduling may be performed in other scenarios in a manner similar to that described above.

FIG. 6 is a table 610 illustrating an example of commands used in a scheduling process according to an example.

In order for the semiconductor memory device (e.g., the semiconductor memory device 10 of FIG. 1 or the semiconductor memory device 20 of FIG. 2) according to the examples to perform the above-described scheduling, in addition to a command generally used in the existing DRAM (e.g., a PRE command for precharging data, an ACT command for activating data, an RD command for reading data, etc.), sub-commands must be added or changed. Table 610 of FIG. 6 shows examples of the commands that need to be added or changed to perform scheduling. In the table 610, a memory controller (MC) may refer to a memory controller included in a host processor outside the semiconductor memory device (e.g., the semiconductor memory device 10 of FIG. 1 or the semiconductor memory device 20 of FIG. 2), and a command control unit (CCU) may be logic included in a control circuit (e.g., the control circuit 130 of FIG. 1 or the control circuits Control circuit 0 and Control circuit 1 of FIG. 2).

The CCU may receive a command from the MC of the host processor and transfer the command to a command generator unit (CGU) in each memory bank. The CGU may receive a DRAM command, and a command and an address with respect to a PIM operation and convert the commands and the address into more detailed sub-commands.

A command "MV-mul" may be a command issued from the memory controller and may indicate a command for starting a matrix vector multiplication operation. In a present example, because the PIM operation is the matrix vector multiplication operation, although the command to start the operation in a memory is referred to as "MV-mul", in another example, the command may be referred to differently according to the type of an operation performed in the memory. A command "SD" is a command issued from the CCU and may indicate a command for slowing down the PIM operation by all MV-banks (i.e., memory banks including a computation circuit). A command "P" is a command issued from the CCU and may indicate a command for pausing the PIM operation by a target MV-bank.

A command "p-PRE" is a command issued from the memory controller and may indicate a command for notifying the pause of the PIM operation by the target bank together with the precharge. The timing at which the corresponding operation is executed after the issuance of the command "p-PRE" needs to be at least tRC. In the present example, the timing of "p-PRE" is set to tRC+tRP as an example for guaranteeing the performance of the PIM operation most. tRC is Row Cycle Time that represents the minimum time interval between successive activation ACTIVE commands with respect to the same bank, and tRP is Row Precharge Time which is the number of clock cycles taken between the issuance of the precharge PRE command and the activation ACT command. In "p-PRE", p may refer to a pause.

A command "s-PRE" is a command issued from the memory controller and may indicate a command for notifying the end of the slow-down of the PIM operation together with the precharge. The timing at which the corresponding operation is executed after the issuance of the command "s-PRE" may be tRP+1tCK. 1tCK is a time corresponding to one clock cycle and may be a time required for command decoding. In s-PRE, s may refer to a slow down.

A command "r-PRE" is a command issued from the memory controller and may indicate a command for notifying the end of the pause of the PIM operation together with the precharge. The timing at which the corresponding operation is executed after the issuance of the command "r-PRE" may be tRP+1tCK. In "r-PRE", r may refer to a resume.

A command "WR-input" is a command issued from the memory controller and may indicate a command for writing an input vector into the SRAM of the MV-bank. The timing at which the corresponding operation is executed after the issuance of the command "WR-input" may be 375 ns. A command "RD-output" is a command issued from the memory controller and may indicate a command for reading an output vector from the SRAM of the MV-bank. The timing at which the corresponding operation is executed after the issuance of the command "RD-output" may be 187.5 ns. However, the timing at which the corresponding operations of "WR-input" and "RD-output" are executed may vary depending on an amount of data read from and written to the SRAM.

Commands "All commands" are issued from the memory controller (e.g., all commands generally used in the existing DRAM, such as a read RD command, a write WR command, the activate ACT command, the precharge PRE command, etc.) and may indicate commands for notifying the start of slow-down of the PIM operation. The timing at which the corresponding operation is executed after the issuance of the commands "All commands" may be 3tCK. 3tCK may correspond to the sum of the time 1tCK required for command decoding and the time 2tCK taken in broadcasting the command "SD". Timing changes corresponding to the commands "All commands" may be necessary when any one MV-bank is not in a slow-down or pause state.

The commands that are shown in the table 610 of FIG. 6 and that need to be added or changed in order to perform scheduling are merely one example. The subject that issues each command may be changed to either MC or CCU, and the term referring to each command may also be appropriately changed. In addition, the timing at which the corresponding operation is executed after the issuance of each command may also be appropriately changed. The examples not limited to the above configuration.

Figure 7:
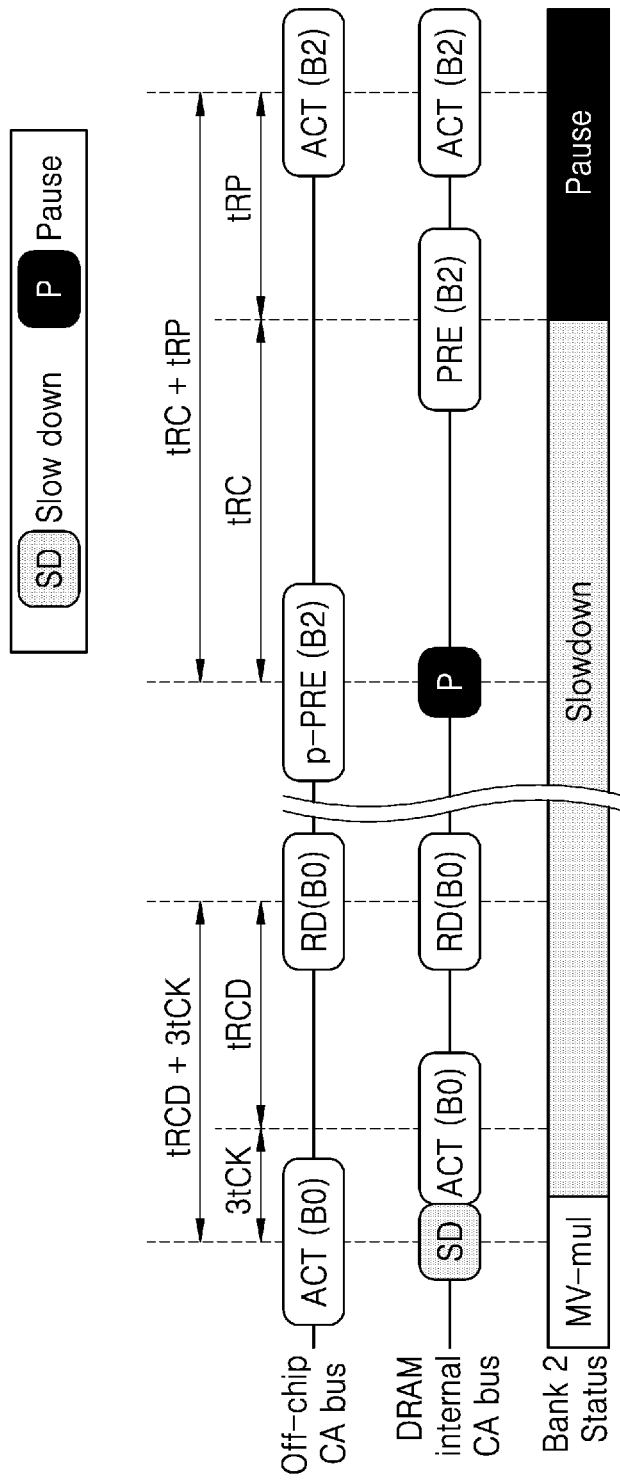
FIG. 7 is a timing diagram corresponding to an example of a scheduling process.

FIG. 7 is a timing diagram corresponding to an example of a scheduling process according to examples.

Referring to FIG. 7, based on commands shown in the table 610 of FIG. 6, the timing at which the scheduling process according to the above-described example is performed is illustrated. Specifically, FIG. 7 illustrates the timing at which an SD command and a P command are performed for parallel processing of memory requests and a PIM operation.

In an example, while the memory bank Bank 2, which is an MV-bank including a computation circuit, is performing the PIM operation (e.g., MV-mul), processing of a memory request for the normal memory bank Bank 0 that does not include a computation circuit may be requested through an off-chip command CA bus. When the activation ACT command is issued to the memory bank Bank 0 through the off-chip command CA bus, the SD command may be first broadcasted to all MV-Banks, and the actual activation ACT command may be transferred to the memory bank Bank 0 after 3tCK through a DRAM internal command CA bus. 3tCK may correspond to the sum of 1 tCK required for processing of command decoding and 2Tck required for broadcasting of the SD command.

In another example, while the memory bank Bank 2 is performing the PIM operation (e.g., MV-mul), processing of a memory request for the memory bank Bank 2 may be requested through the off-chip command CA bus. When the p-PRE command is issued to the memory bank Bank 2 through the off-chip command CA bus, the P command may be first transferred to the target memory bank Bank 2, through the DRAM internal command CA bus, and the actual PRE command may be transferred to the memory bank Bank 2 after tRC. Accordingly, the memory bank Bank 2 may pause the PIM operation, store a result of the operation up to present, precharge a currently activated DRAM row, and then activate the DRAM row corresponding to a memory request after Trp, which is a time for guaranteeing the precharge in order to process the memory request.

As described above, the semiconductor memory device (e.g., the semiconductor memory device 10 of FIG. 1 or the semiconductor memory device 20 of FIG. 2) according to the examples may broadcast a command for instructing the adjustment or pause of the PIM operation according to a preset timing by a group of memory banks (e.g., the first memory bank group 110 of FIG. 1 or the memory banks Bank 2 to Bank 5 and Bank 10 to Bank 13 of FIG. 2) that include a computation circuit, in order to concurrently perform the PIM operation as efficiently as possible through scheduling and the processing of the memory request.

With the addition or change of commands, because the timings at which the corresponding operation is executed after the issuance of the commands are adjusted, the commands may not be necessarily processed separately in all memory banks, and scheduling may be appropriately performed under the control of the control circuit (e.g., the control circuit 130 of FIG. 1 or the control circuits Control circuit 0 and Control circuit 1 of FIG. 2). In addition, an amount of usage of the command CA bus for commands may be reduced.

Figure 8:
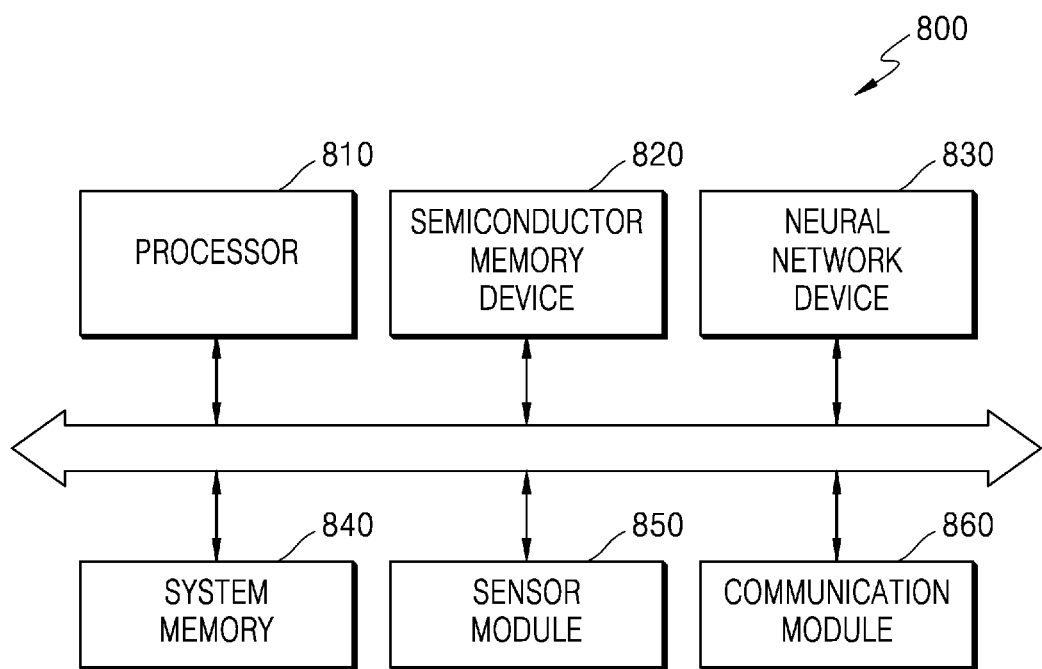
FIG. 8 is a block diagram of an electronic system according to an example.

FIG. 8 is a block diagram of an electronic system 800 according to examples.

Referring to FIG. 8, the electronic system 800 may analyze input data based on a neural network in real time to extract effective information, make a situation determination based on the extracted information, or control configurations of an electronic device on which the electronic system 800 is mounted. For example, the electronic system 800 may be applied to a robotic device such as a drone, an advanced driver assistance system (ADAS), etc., a smart TV, a smart phone, a medical device, a mobile device, an image display device, a measurement device, an IoT device, etc., and may be mounted on at least one of various kinds of electronic devices. For example, the electronic system 800 may be a server.

The electronic system 800 may include a processor 810, a semiconductor memory device 820, a neural network device 830, a system memory 840, a sensor module 850, and a communication module 860. The electronic system 800 may further include an input/output module, a security module, a power control device, etc. Some of the hardware components of the electronic system 800 may be mounted on at least one semiconductor chip.

The processor 810 controls the overall operation of the electronic system 800. The processor 810 may include one processor core (Single Core) or may include a plurality of processor cores (Multi-Core). The processor 810 may process or execute programs and/or data stored in the system memory 840. In some examples, the processor 810 may control the function of the semiconductor memory device 820 or the neural network device 830 by executing the programs stored in the system memory 840. The processor 810 may be implemented as a central processing unit (CPU), a graphics processing unit (GPU), an application processor (AP), or the like. The processor 810 may include a memory controller for controlling the semiconductor memory device 820 or the system memory 840.

The semiconductor memory device 820 may temporarily store programs, data, or instructions. For example, the programs and/or the data stored in the system memory 840 may be temporarily stored in the semiconductor memory device 820 according to the control of the processor 810 or booting code. The semiconductor memory device 820 may be implemented as a memory such as DRAM. The semiconductor memory device 820 may correspond to the semiconductor memory device (e.g., the semiconductor memory device 10 of FIG. 1 or the semiconductor memory device 20 of FIG. 2) described with reference to FIGS. 1 to 7. The semiconductor memory device 820 corresponds to a PIM including a computation circuit, thereby performing not only a memory function of storing data but also a function of a processor performing a computation operation.

A computation circuit included in the semiconductor memory device 820 may be referred to as an internal processor because the computation circuit exists inside the semiconductor memory device 820, and the processor 810 may be referred to as a host processor or an external processor because the processor 810 exists outside the semiconductor memory device 820. A PIM architecture enables a fast memory access of a low latency because the internal processor and the memory are implemented onchip. In addition, when the PIM architecture uses parallelism of a bank unit or a bank group unit, the PIM architecture may utilize several to tens of times the memory bandwidth compared to the general memory access. The semiconductor memory device 820 including the PIM architecture may also be referred to as terms such as intelligent random access memory (RAM), computational RAM, or smart memory, etc.

The semiconductor memory device 820 may perform an operation of a neural network using the computation circuit based on the internally stored data and generate an information signal based on a result of performing the operation. The information signal may include one of various types of recognition signals such as a voice recognition signal, an object recognition signal, an image recognition signal, a biometric information recognition signal, etc. In an example, the neural network implemented by the semiconductor memory device 820 may be an RNN, but is not limited thereto. The neural network implemented by the semiconductor memory device 820 may include a convolutional neural network (CNN), a feedforward neural network (FNN), deep belief networks, restricted Boltzmann machines, etc. The semiconductor memory device 820 may be used for various applications such as image recognition, time series prediction, rhythm learning, etc. as well as a natural language process (NLP) application such as speech recognition, machine translation, language model, language prediction. etc.

The electronic system 800 may further include a separate neural network device 830 in addition to the semiconductor memory device 820 to implement the neural network. In this case, the semiconductor memory device 820 may operate as a general memory to provide necessary data to the neural network device 830.

The neural network device 830 may perform the operation of the neural network based on the received input data, and generate the information signal based on a result of the operation. The neural network may include, but is not limited to, CNN, RNN, FNN, Deep Belief Networks, Restricted Boltzman Machines, and the like. The neural network device 830 may drive the neural network separate from the semiconductor memory device 820, and may drive one neural network in cooperation with the semiconductor memory device 820.

The system memory 840 is a storage location for storing data, and may store an operating system (OS), various programs, and various data. In an example, the system memory 840 may store intermediate results generated during a process of performing the operation of the semiconductor memory device 820 or the neural network device 830.

The system memory 840 may include at least one of volatile memory and nonvolatile memory. The nonvolatile memory includes ROM, PROM, EPROM, EEPROM, flash memory, PRAM, MRAM, RRAM, FRAM and the like. The volatile memory includes DRAM, SRAM, SDRAM, PRAM, MRAM, RRAM, FeRAM and the like. In an example, the system memory 840 may include at least one of HDD, SSD, CF, SD, Micro-SD, Mini-SD, xD, or Memory Stick.

The sensor module 850 may collect information around the electronic device on which the electronic system 800 is mounted. The sensor module 850 may sense or receive a signal (e.g., an image signal, a sound signal, a magnetic signal, a bio signal, a touch signal, etc.) from the outside of the electronic device, and convert the sensed or received signal into data. To this end, the sensor module 850 may include at least one of various types of sensing devices such as a microphone, an imaging device, an image sensor, a light detection and ranging (LIDAR) sensor, an ultrasonic sensor, an infrared sensor, a bio sensor, a touch sensor, etc.

The sensor module 850 may provide the converted data to the semiconductor memory device 820 or the neural network device 830 as input data. For example, the sensor module 850 may include an image sensor, capture an external environment of the electronic device to generate a video stream, and sequentially provide continuous data frames of the video stream to the semiconductor memory device 820 or the neural network device 830 as the input data. However, the configuration of the sensor module 850 is not limited thereto, and the sensor module 850 may provide various types of data to the semiconductor memory device 820 or the neural network device 830.

The communication module 860 may have various wired or wireless interfaces that may communicate with an external device. For example, the communication module 860 may include a communication interface connectable to wireless local area network (WLAN) such as Local Area Network (LAN), Wi-Fi (Wireless Fidelity), Wireless Personal Area Network (WPAN) such as Bluetooth (Bluetooth), mobile cellular network such as Wireless USB (Wireless Universal Serial Bus), Zigbee, Near Field Communication (NFC), Radio-frequency identification (RFID), Power Line communication (PLC), or 3rd Generation (3G), 4th Generation (4G), Long Term Evolution (LTE), and the like.

Figure 9:
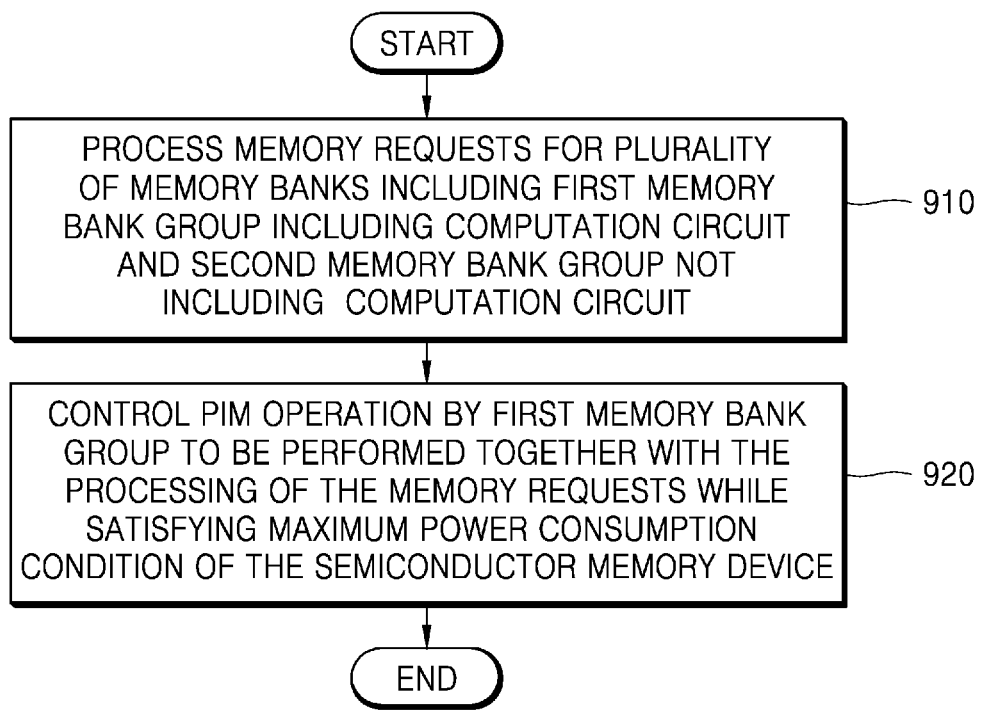
FIG. 9 is a flowchart illustrating a method of operating a semiconductor memory device according to an example.

FIG. 9 is a flowchart illustrating a method of operating a semiconductor memory device according to examples.

Referring to FIG. 9, the method of operating the semiconductor memory device may include operations processed in time series by a semiconductor memory device (e.g., the semiconductor memory device 10 of FIG. 1 or the semiconductor memory device 20 of FIG. 2) described with reference to FIGS. 1 to 7. Therefore, even if omitted below, the descriptions provided above with regard to the semiconductor memory device of FIGS. 1 to 7 (e.g., the semiconductor memory device 10 of FIG. 1 or the semiconductor memory device 20 of FIG. 2) may also be applied to the method of operating the semiconductor memory device of FIG. 9.

In operation 910, the semiconductor memory device may process memory requests for a plurality of memory banks including a first memory bank group including a computation circuit and a second memory bank group not including the computation circuit. In an example, the semiconductor memory device may be DRAM. In this case, each of the plurality of memory banks may include one or more DRAM arrays, and the memory request may correspond to a DRAM request including at least one of read, write, copy, and delete. The computation circuit included in each of the memory banks included in the first memory bank group may perform an operation using data read from the corresponding memory bank, and rewrite a result of the operation to the corresponding memory bank or output the result to the outside. The operation performed by a computation circuit included in each of the memory banks included in the first memory bank group may be referred to as a PIM operation.

In operation 920, the semiconductor memory device may control the PIM operation by the first memory bank group to be performed together with the processing of the memory requests while satisfying a maximum power consumption condition of the semiconductor memory device. For example, the semiconductor memory device may control the sum of power consumed for the processing of the memory requests and power consumed for the PIM operation to be within the maximum power consumption condition through the adjustment or pause of the PIM operation by the first memory bank group.

The semiconductor memory device may perform scheduling on the processing of the memory requests and the PIM operation based on numbers counted by a request counter that counts memory requests for each of the plurality of memory banks according to a predetermined period. In an example, when a number corresponding to the second memory bank group among the numbers counted by the request counter is equal to or greater than a preset threshold value, in order to process a memory request for the second memory bank group, the semiconductor memory device may slow down the PIM operation by the first memory bank group.

In another example, when the first memory bank group includes a third memory bank and a fourth memory bank, and a number corresponding to the third memory bank among the numbers counted by the request counter is equal to or greater than the preset threshold value, in order to process a memory request for the third memory bank, the semiconductor memory device may pause the PIM operation by the third memory bank and slow down the PIM operation by the fourth memory bank.

The semiconductor memory device may broadcast a command for instructing the adjustment or pause of the PIM operation by the first memory bank group to the first memory bank group according to a preset timing. As described above, the semiconductor memory device may concurrently perform the processing of memory requests while performing the PIM operation as efficiently as possible through scheduling.

The semiconductor memory device may perform the PIM operation by placing a computation circuit only in some of the memory banks in order to obtain the maximum performance while minimizing the area overhead within the available design space. For example, the number of memory banks included in the first memory bank group among the plurality of memory banks may be determined such that when all of the memory banks included in the first memory bank group perform a read operation for the PIM operation, the power consumed by the semiconductor memory device is within the maximum power consumption condition.

The method of operating the semiconductor memory device may be recorded in a computer-readable recording medium having recorded one or more programs including instructions for executing the method. Examples of the computer-readable recording medium include magnetic media such as a hard disk, a floppy disk and magnetic tape, optical media such as CD-ROM and DVD, magneto-optical media such as a floptical disk, and hardware devices specifically configured to store and execute program instructions, for example, ROM, RAM, and a flash memory. Examples of program instructions include machine language code such as those generated by a compiler, as well as high-level language code that may be executed by a computer by using an interpreter or the like.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor memory device employing processing in memory (PIM), the semiconductor memory device comprising:
   a plurality of memory banks comprising a first memory bank group comprising a computation circuit and a second memory bank group without a computation circuit; and
   a control circuit configured to control a PIM operation by the first memory bank group to be performed simultaneously with processing of memory requests for the plurality of memory banks while satisfying a predetermined processing condition of the semiconductor memory device.

2. The semiconductor memory device of claim 1, wherein the control circuit is configured to adjust and/or pause the PIM operation by the first memory bank group to satisfy the predetermined processing condition.

3. The semiconductor memory device of claim 1, wherein the control circuit comprises a request counter configured to count memory requests for each of the plurality of memory banks according to a predetermined period, and
   the control circuit is configured to, based on numbers counted by the request counter, perform scheduling on the processing of the memory requests and the PIM operation.

4. The semiconductor memory device of claim 3, wherein the control circuit is configured to, when a number corresponding to the second memory bank group among the numbers counted by the request counter is equal to or greater than a preset threshold value, slow down the PIM operation by the first memory bank group in order to process a memory request for the second memory bank group.

5. The semiconductor memory device of claim 3, wherein, when the first memory bank group comprises a first memory bank and a second memory bank, and a number corresponding to the first memory bank among the numbers counted by the request counter is equal to or greater than the preset threshold value, the control circuit is configured to pause the PIM operation by the first memory bank and slow down the PIM operation by the second memory bank in order to process a memory request for the first memory bank.

6. The semiconductor memory device of claim 1, wherein the control circuit is configured to broadcast a command for instructing an adjustment or pause of the PIM operation by the first memory bank group to the first memory bank group according to a preset timing.

7. The semiconductor memory device of claim 1, wherein a number of memory banks included in the first memory bank group among the plurality of memory banks is configured such that when all of the memory banks included in the first memory bank group perform a read operation for the PIM operation, the semiconductor memory device satisfies the predetermined processing condition.

8. The semiconductor memory device of claim 1, wherein each of the plurality of memory banks comprises one or more dynamic random access memory (DRAM) arrays, and wherein the memory request is a DRAM request comprising at least one of read, write, copy, and erase.

9. The semiconductor memory device of claim 1, wherein the computation circuit included in the first memory bank group is configured to perform an operation using data read from a corresponding memory bank, and to rewrite a result of the operation to the corresponding memory bank or to output the result to the outside.

10. The semiconductor memory device of claim 1, wherein the computation circuit comprises hardware that performs at least one of an arithmetic operation, a logic operation, and a shift operation.

11. The semiconductor memory device of claim 1, wherein the predetermined processing condition comprises an indication of an accumulation value of memory processing requests for a first memory bank from the second memory bank group within an interval.

12. A method of operating a semiconductor memory device employing processing in memory (PIM), the method comprising:
   processing memory requests for a plurality of memory banks comprising a first memory bank group comprising a computation circuit and a second memory bank group without a computation circuit; and
   controlling a PIM operation by the first memory bank group to be performed simultaneously with processing of the memory requests while satisfying a predetermined processing condition of the semiconductor memory device.

13. The method of claim 12, wherein the controlling comprises:
   adjusting and/or pausing the PIM operation by the first memory bank group to satisfy the predetermined processing condition.

14. The method of claim 12, wherein the controlling comprises:
   performing scheduling on the processing of the memory requests and the PIM operation based on numbers counted by a request counter configured to count memory requests for each of the plurality of memory banks according to a predetermined period.

15. The method of claim 14, wherein the performing of the scheduling comprises:
   when a number corresponding to the second memory bank group among the numbers counted by the request counter is equal to or greater than a preset threshold value, slowing down the PIM operation by the first memory bank group in order to process a memory request for the second memory bank group.

16. The method of claim 14, wherein the performing of the scheduling comprises:
   when the first memory bank group comprises a first memory bank and a second memory bank and a number corresponding to the first memory bank among the numbers counted by the request counter is equal to or greater than the preset threshold value, pausing the PIM operation by the first memory bank and slowing down the PIM operation by the second memory bank in order to process a memory request for the first memory bank.

17. The method of claim 12, further comprising:
   broadcasting a command for instructing an adjustment or pause of the PIM operation by the first memory bank group to the first memory bank group according to a preset timing.

18. The method of claim 12, wherein a number of memory banks included in the first memory bank group among the plurality of memory banks is configured such that when all of the memory banks included in the first memory bank group perform a read operation for the PIM operation, the semiconductor memory device satisfies the predetermined processing condition.

19. The method of claim 12,
   wherein each of the plurality of memory banks comprises one or more dynamic random access memory (DRAM) arrays, and
   wherein the memory request corresponds to a DRAM request comprising at least one of read, write, copy, and erase.

20. The method of claim 12, wherein the computation circuit included in the first memory bank group is configured to perform an operation using data read from the corresponding memory bank, and to rewrite a result of the operation to the corresponding memory bank or to output the result to the outside.

21. A non-transitory computer-readable recording medium having recorded thereon one or more programs including instructions to execute the method of claim 12.

22. The semiconductor memory device of claim 11, wherein the control circuit is configured to, in a subsequent interval, when the accumulation value for the first memory bank exceeds a preset threshold value, slow the PIM operation by a second memory bank of the first memory bank group to perform a memory operation transferred from the first memory bank to the second memory bank.

* * * * *